(12) United States Patent
Ghose et al.

(10) Patent No.: US 9,557,178 B2
(45) Date of Patent: Jan. 31, 2017

(54) INDOOR POSITIONING SYSTEM (71) Applicant: Tata Consultancy Services Ltd., Mumbai, Maharashtra (IN)

(72) Inventors: Avik Ghose, Kolkata (IN); Arpan Pal, Kolkata (IN); Anirban Dutta Choudhury, Kolkata (IN); Vivek Chandel, Sriganganagar (IN); Chirabrata Bhaumik, Kolkata (IN); Tanushyam Chattopadhyay, Kolkata (IN)

(73) Assignee: Tata Consultancy Services Ltd., Mumbai (IN)

( * ) Notice: Subject to any disclaimer, the term of this patent is extended or adjusted under 35 U.S.C. 154(b) by 37 days.

(21) Appl. No.: 14/450,890

(22) Filed: Aug. 4, 2014

(65) Prior Publication Data

US 2015/0039226 A1 Feb. 5, 2015

(30) Foreign Application Priority Data

Aug. 5, 2013 (IN) .......................... 2571/MUM/2013

(51) Int. Cl.
*G01C 21/20* (2006.01)
*G01R 33/038* (2006.01)
(Continued)

(52) U.S. Cl.
CPC .......... *G01C 21/206* (2013.01); *G01R 33/038* (2013.01); *H04W 4/04* (2013.01); *H04W 64/00* (2013.01)

(58) Field of Classification Search
CPC ........ G01C 21/00; G01C 21/206; H04W 4/02; H04W 4/04; H04W 64/00; G06T 11/206; G01R 33/038
(Continued)

(56) References Cited

U.S. PATENT DOCUMENTS 6,393,360 B1 * 5/2002 Ma .......................... G01C 21/30
340/905
9,170,112 B2 * 10/2015 Mirov ..................... G01C 21/08
701/525
(Continued)

FOREIGN PATENT DOCUMENTS

DE 10127156 A1 12/2002
IN 21220 9/1935
(Continued)

*Primary Examiner* — Shardul Patel
(74) *Attorney, Agent, or Firm* — Robert Plotkin, P.C.; Robert Plotkin (57) ABSTRACT

An indoor positioning system and method of localizing a person/object in an indoor environment by identifying the orientation and direction of a person/object to provide a true location of the person/object without navigation errors. The system comprises magnets disposed on a doorway to create a unique magnetic field; a wireless communication unit comprising a magnetometer sensor to sense perturbations in each of the unique magnetic fields in the event that the person/object with the wireless communication unit passes through the doorway, and generate corresponding signals; a processor receiving the signals and extracting data from the same; and a backend server wirelessly communicating with the wireless communication unit, the backend server processing the data sample received from the wireless communication unit to identify the opening and the wireless communication unit to localize the person/object.

8 Claims, 9 Drawing Sheets

(51) Int. Cl.
*H04W 4/04* (2009.01)
*H04W 64/00* (2009.01)

(58) Field of Classification Search
USPC ............ 701/525, 410, 400, 49, 36; 709/204;
700/275; 73/800; 250/221; 702/94
See application file for complete search history.

(56) References Cited

U.S. PATENT DOCUMENTS

| | | | |
|---|---|---|---|
| 2012/0130632 A1* | 5/2012 | Bandyopadhyay | G01C 17/38 701/446 |
| 2012/0143495 A1* | 6/2012 | Dantu | G01C 21/206 701/428 |
| 2013/0261964 A1* | 10/2013 | Goldman | G01C 21/12 701/500 |
| 2014/0169628 A1* | 6/2014 | Isert | G01C 22/006 382/103 |
| 2014/0229103 A1* | 8/2014 | Mirov | G01C 21/08 701/525 |
| 2014/0335893 A1* | 11/2014 | Ronen | G01S 5/0252 455/456.1 |

FOREIGN PATENT DOCUMENTS

| | | |
|---|---|---|
| JP | 2011033609 A | 2/2011 |
| JP | 2011059091 A | 3/2011 |
| WO | 2013065042 A1 | 5/2013 |

* cited by examiner

INDOOR POSITIONING SYSTEM

FIELD OF DISCLOSURE

The present disclosure relates to tracking and locating a person/object.

DEFINITIONS

The expression 'moving subject' used hereinafter in the specification refers to but is not limited to persons/objects moving through an enclosed environment.

The expression 'opening' used hereinafter in the specification refers to but is not limited to walls having doorways, entrances, exits, room dividers and the like that may be utilized to provide access through an environment divided into various functional spaces.

These definitions are in addition to those expressed in the art.

BACKGROUND

Locating and/or tracking a person or an object in an indoor space or a confined area is typically referred to as indoor positioning, indoor localization, local positioning and the like. Indoor positioning is used for many applications such as locating or giving directions to tourists in an exhibition, locating doctors/nurses/medical equipment in a hospital, locating personnel as well as containers/merchandise in a large warehouse and the like.

Systems employed for indoor positioning, as known in the art, are typically based on inertial navigation wherein these systems generally incorporate technologies such as Global Positioning System (GPS) based tracking, wireless/WiFi tracking using Radio Frequency (RF) communication and typically use sensors such as gyroscopes, accelerometers and electromagnetic field sensors for location detection. Typically a wireless communication device carried by a person or affixed onto an object, sends out wireless signals which are picked up by sensors placed at different locations within the indoor environment and used for locating and/or tracking the person/object. Some systems use beacons embedded in wireless communication devices that transmit/broadcast signals which are picked up by WiFi receivers placed at different locations in the indoor environment and are used to locate the person/object by mapping the indoor environment or via the GPS. Other systems use RFID tags affixed onto the object or carried by the person while moving around in the indoor environment. The RFID tags are detected by sensors placed at different locations when the person/object passes near the sensor whereupon the sensor signals are used to locate the person/object.

Several endeavors have been made in this field for localizing a moving person/object. For instance, U.S. Pat. No. 6,393,360 discloses a method of outdoor localization. WO/2013/065042 discloses a method of both indoor and outdoor localization using earth magnetic field readings and electromagnetic signals.

JP2011033609 and JP2011059091 disclose an indoor position detector wherein three electromagnetic field sources are installed indoors to generate alternating magnetic fields having different frequencies. Again, US20120130632 discloses a system and method for locating, tracking, and/or monitoring the status of personnel and/or assets, both indoors and outdoors by deploying electromagnets.

Furthermore, DE10127156 discloses a local positioning system for moving objects including people, animals or vehicle to determine if the object is in danger and automatically dials a number. The position determination by the system is based on calculation of distance between a transmitter on the body of the object and a receiver. Such calculations can be complicated and lead to errors especially if the path taken by the moving object is not necessarily linear.

Still further, IN21220 discloses a container tracking system used to track shipping containers in a storage and transfer yard. Three dimensional accelerometers are provided on moving containers and position determination is based on direction of movement and acceleration magnitude information.

While indoor positioning systems known in the art can determine location of a person/object, need for a simple, accurate and robust system and method of localizing a moving subject is especially critical in emergency situations such as fire, water logging and the like to evacuate people from the indoor environment. As explained herein above the systems known in the art use geo-magnetic field distortions in the indoor environment for location detection which are susceptible to change due to change in indoor environment as well as weather conditions. Alternatively, electro-magnetic sensors used in these systems incur significant infrastructural changes and associated costs.

Thus there is a need for a system for locating a person or an object in an indoor environment that is free from disturbance due to environmental changes and from inertial navigation errors due to geo-magnetic field distortions and that can detect the orientation of the person/object.

OBJECTS

Some of the objects of the present disclosure aimed to ameliorate one or more problems of the prior art or to at least provide a useful alternative are listed herein below.

An object of the present disclosure is to provide an indoor positioning system that can localize a person/object in an indoor environment.

Another object of the present disclosure is to provide an indoor positioning system that can detect orientation and direction of the person/object.

Yet another object of the present disclosure is to provide an indoor positioning system that is free from disturbance due to environmental changes.

Still another object of the present disclosure is to provide an indoor positioning system that is free from inertial navigation errors.

One more object of the present disclosure is to provide an indoor positioning system that does not incur infrastructural changes and is cost effective.

Other objects and advantages of the present disclosure will be more apparent from the following description when read in conjunction with the accompanying figures, which are not intended to limit the scope of the present disclosure.

SUMMARY

In accordance with the present disclosure, there is provided an indoor positioning system for localizing a moving subject in an enclosed environment, divided into functional spaces said environment having at least one opening for providing access to said spaces, the system comprising:

at least two permanent magnets disposed on the opening in a pre-determined orientation to create a unique magnetic field for each opening;

a wireless communication unit associated with the moving subject, the wireless communication unit comprising:

at least one magnetometer sensor, the magnetometer sensor adapted to sense perturbations in each of the unique magnetic fields in the event that the moving subject passes through the openings, and generate signals corresponding to at least one parameter selected from the group consisting of:
direction of motion of the moving subject,
orientation of the wireless communication unit,
orientation of the magnetic field and
speed of motion of the moving subject; and
a processor adapted to receive the signals and extract data corresponding to the parameters; and a backend server wirelessly communicating with the wireless communication unit, the backend server adapted to process the data received from the wireless communication unit by using a pre-determined processing method to identify the opening and the wireless communication unit to localize the moving subject.

The permanent magnets can be rare-earth magnets.

Two permanent magnets can be placed at an opening in an orientation selected from the group consisting of orthogonal placement, straight parallel placement, slanting parallel placement, slanting concavo-convex placement and random placement with reference to each other.

The wireless communications unit can be at least one of a smartphone and a mobile phone. The magnetometer sensor can be a three-axis magnetometer sensor.

Further in accordance with the present disclosure, there is provided a method for localizing a moving subject in an enclosed environment, divided into functional spaces said environment having at least one opening for providing access to said spaces, said method comprising the following steps:

positioning at least two magnets at each opening in a pre-determined orientation to create a magnetic field;

sensing perturbations in the magnetic field along X, Y and Z axes and generating corresponding signals;

receiving the signals and extracting associated data;

communicating the data;

processing the communicated data by using a pre-determined processing method to identify an opening and localize the moving subject.

The step of processing the communicated data by using a pre-determined processing method further comprises the following steps:

computing absolute value of a pre-determined sample of data along the X-axis;

detecting peak/trough of the data sample along the X-axis;

comparing the peak of the data sample along the X-axis with the peak of a base data to determine the direction of motion of the moving subject along two directions, the directions being along the magnetic field or against the magnetic field;

determining width of the peak/trough of the data sample along the X-axis;

performing data mining on the data sample along X, Y and Z axes by a cluster analysis method to determine Region of Interest (ROI);

performing Time Domain Normalization (TDN) on the data sample along with the data sample along Y-axis and Z-axis over the ROI to obtain normalized data for Y-axis and Z-axis;

performing Discrete Wavelet Transform (DWT) on the normalized data for Y-axis and Z-axis; and classifying the DWT coefficients of the Y-axis and Z-axis by using a pre-determined classification method to localize the moving subject.

Additionally, the step of performing data mining includes the following steps:

performing 2-cluster k-means clustering on the data sample along X, Y and Z axes; and utilizing the maxima and minima of the data sample along X, Y and Z axes.

The classification method can be Support Vector Machine (SVM) based classification method.

BRIEF DESCRIPTION OF ACCOMPANYING DRAWINGS

The indoor positioning system of the present disclosure will now be described with the help of the accompanying drawings, in which.

DETAILED DESCRIPTION

Systems employed for locating and/or tracking a person or an object in an indoor space or a confined area are typically based on inertial navigation techniques. These systems generally incorporate technologies such as Global Positioning System (GPS) based tracking or wireless/WiFi tracking using Radio Frequency (RF) communication and typically use sensors such as gyroscopes, accelerometers, electromagnetic field sensors, and the like for location detection. Although inertial navigation is a low-power and low cost method of localizing people in indoor environments, the problem with this approach is that it suffers from drift and spread due to sensor errors. Efforts to reduce such errors using methods such as particle filter based on floor plan, suffer from issues when there are few closed spaces. Hence some means of anchoring is needed. RF based anchoring needs modification of the infrastructure which involves cost and may not be practically feasible in home scenarios. Hence, inertial indoor localization still has unsolved problems that need to be addressed.

Furthermore, these systems typically implement geomagnetic field modeling techniques for location detection. However, modeling of the geo-magnetic field is susceptible to change with changes in weather and indoor environment (such as movement of furniture etc.). Moreover, these systems determine the location of the person/object without accounting for information in relation to orientation and direction of the person/object.

Thus to overcome these aforementioned limitations, the present disclosure envisages an indoor positioning system and method of localizing a person/object in an indoor environment by detecting the orientation and direction of the person/object to provide a true location of the person/object without navigation errors.

The system herein and the various features and advantageous details thereof are explained with reference to the non-limiting embodiments in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The indoor positioning system of the present disclosure will now be described with reference to the embodiments shown in the accompanying drawings. The embodiments do not limit the scope and ambit of the disclosure. The description relates purely to the examples and preferred embodiments of the disclosed tool and its suggested applications.

The indoor positioning system of the present disclosure is explained herein after with reference to localizing a moving subject in an indoor/enclosed environment divided into functional spaces and having openings at various locations for providing access to the functional spaces. The moving subject being a person and the opening being a doorway is purely for ease of explanation.

The indoor positioning system of the present disclosure implements a method of localizing a person in an indoor environment wherein a magnetometer in a wireless communication unit, typically a smartphone/mobile phone, interacts with externally deployed magnets in 3D space, preferably on a doorway, and provides a unique magnetic identification of the location. The indoor positioning method of the present disclosure is based on permanent magnets which can be used for preparing anchor points in the indoor environment that can be used to correct inertial navigation errors. The indoor positioning system of the present disclosure includes deploying multiple magnets on a doorway in a known orientation to create a unique magnetic field. Typically at least two magnets are disposed on the doorway. When a person carrying the smartphone/mobile phone in a specific orientation passes through the doorway, the magnetometer signals produce perturbations based on the field in 3D space. By fingerprinting these perturbations, the doors can be identified uniquely thereby localizing the person.

Figure 1:
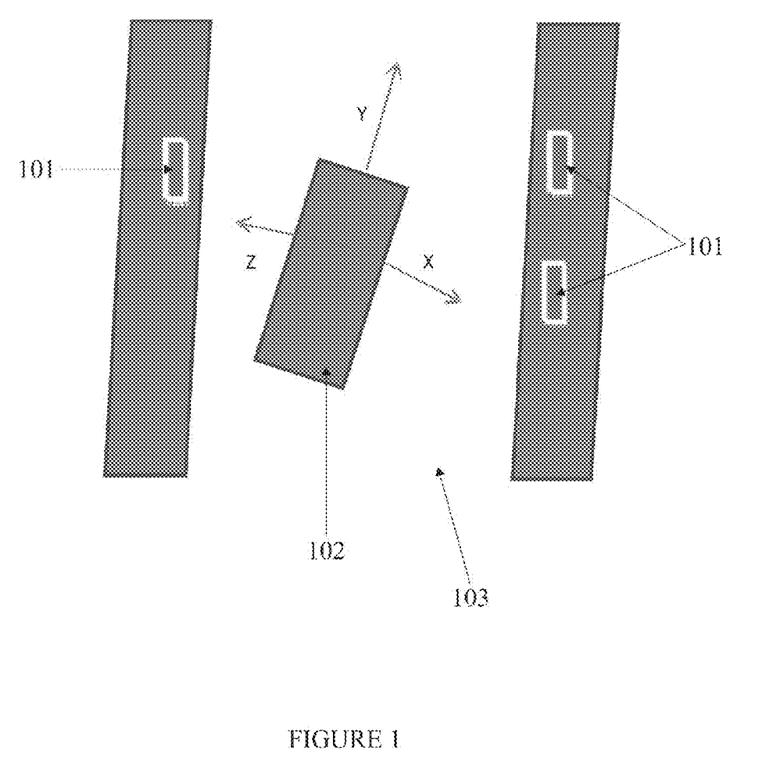
FIG. 1 is a schematic representation illustrating a setup of an indoor positioning system in accordance with an embodiment of the present disclosure.

Referring to FIG. 1, a schematic representation of a setup of an indoor positioning system in accordance with an embodiment of the present disclosure is illustrated. This embodiment is based on the principle that when a magnetic dipole is passed through a magnetic field it is acted upon by a force based on the orientation of the magnetic field. Furthermore, the magnetic lines of force do not follow a straight line but rather an ellipsoid curvature is observed. In accordance with an exemplary embodiment, three permanent/rare-earth magnets (101) are disposed on a doorway (103). When a person with a smartphone/mobile phone (102) comprising a 3-axis magnetometer sensor (considered analogous to three orthogonal magnetic dipoles) passes through the magnetic field created in the doorway due to the permanent/rare-earth magnets, the magnetometer records unique perturbations based on the direction of the motion, the orientation of the phone, the orientation of the field and the speed of motion, and generates corresponding signals.

In accordance with another embodiment, the magnets (101) are disposed on the walls adjacent to the doorway. In accordance with yet another embodiment, the magnets (101) are embedded within a frame associated with the doorway.

Figure 2:
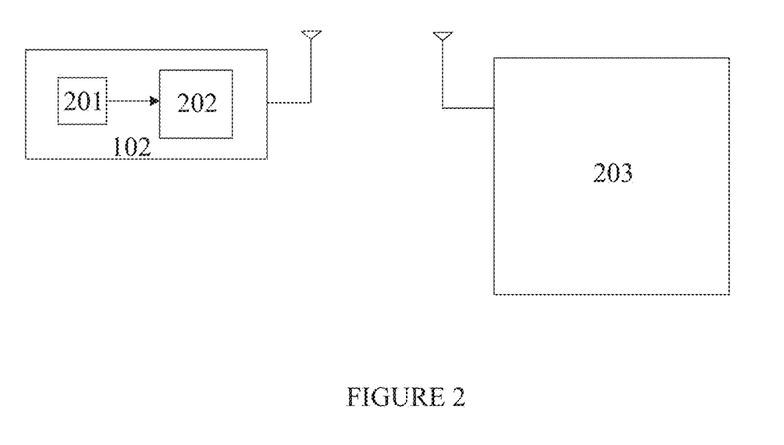
FIG. 2 is a schematic representation illustrating an indoor positioning system of the present disclosure.

Referring to FIG. 2, a schematic representation of the indoor positioning system of the present disclosure is illustrated. A processor (202) within the smartphone/mobile phone (102) running a smartphone application reads the magnetometer (201) signals and extracts features/data which are wirelessly sent to a backend server (203). The backend server matches the extracted features/data with known sets of data using signal processing techniques whereby the doorway (103) and the smartphone/mobile phone (102) are identified to localize the person. The backend server (203) is typically deployed on a computing platform referred to as Real-Time Integrated Platform for Services & Analytics (RIPSAC) developed by the applicant.

Typically, in android based smartphones, the phone major axis is always Y-axis. Hence, a person carrying a smartphone in an orientation whereby the Y-axis is aligned to the direction of motion causes the X-axis to be directly aligned in the direction of the magnetic field and Z-axis to be orthogonal to the magnetic field. However, since magnetic lines of force do not travel in a straight line, magnetometer readings are obtained along all three axes.

Figure 3A:
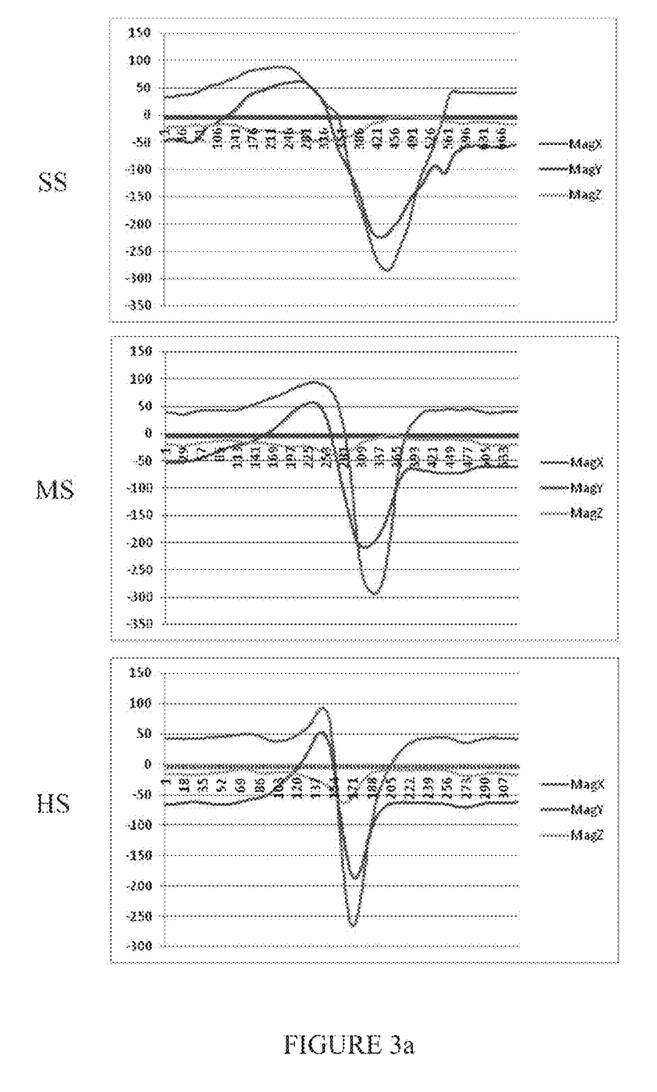
FIGS. 3a, 3b, 3c and 3d illustrate graphical representations of magnetic lines of forces when magnets disposed on a doorway are oriented in different directions.
Figure 3B:
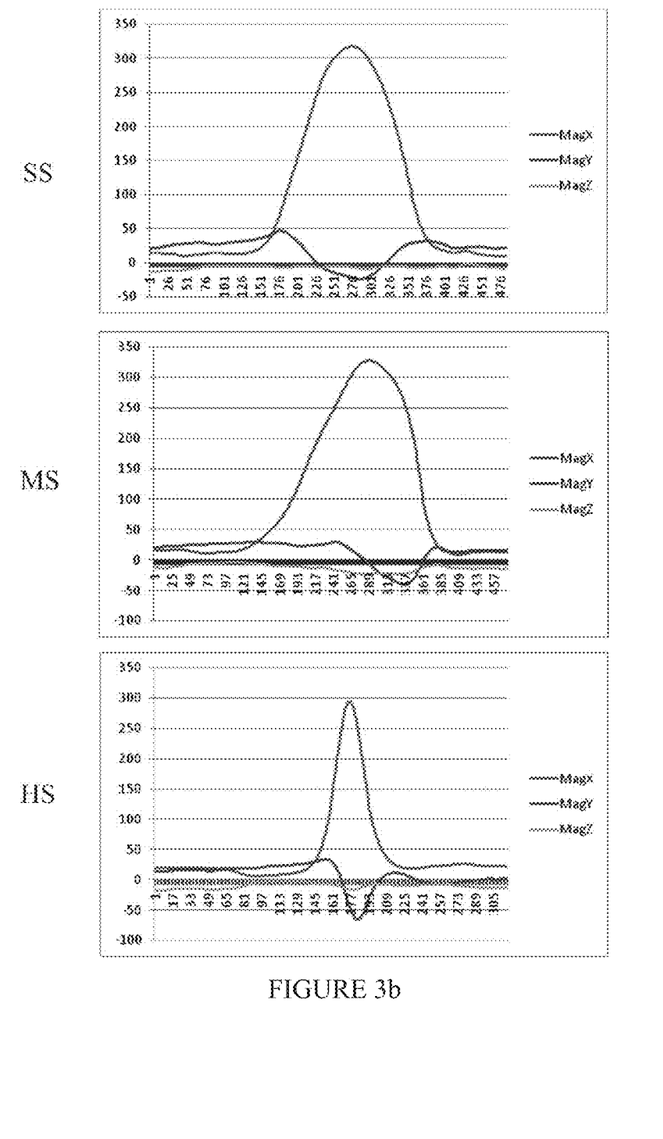
Figure 3C:
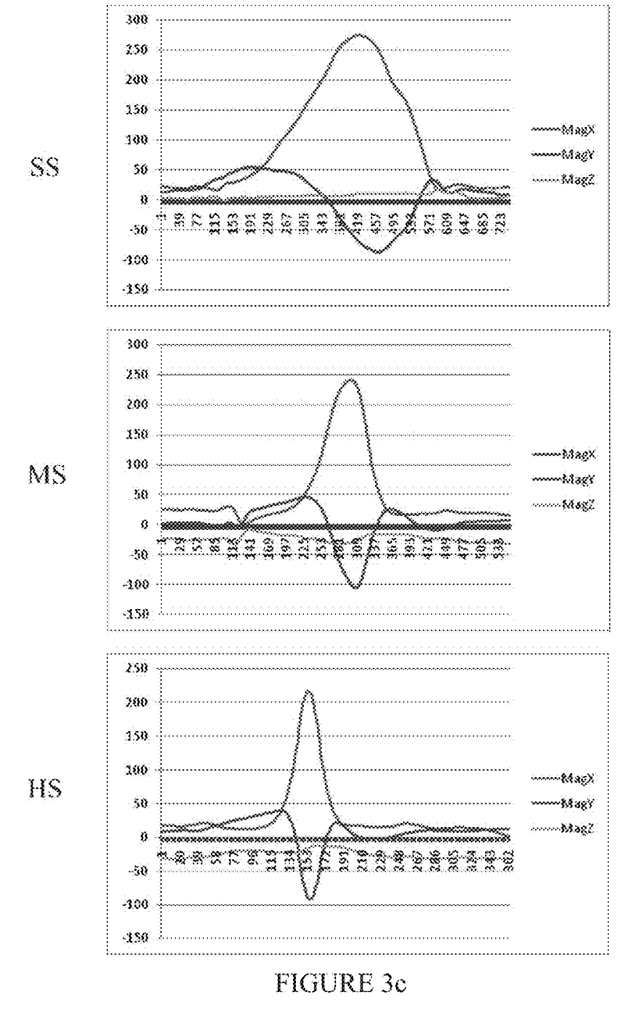
Figure 3D:
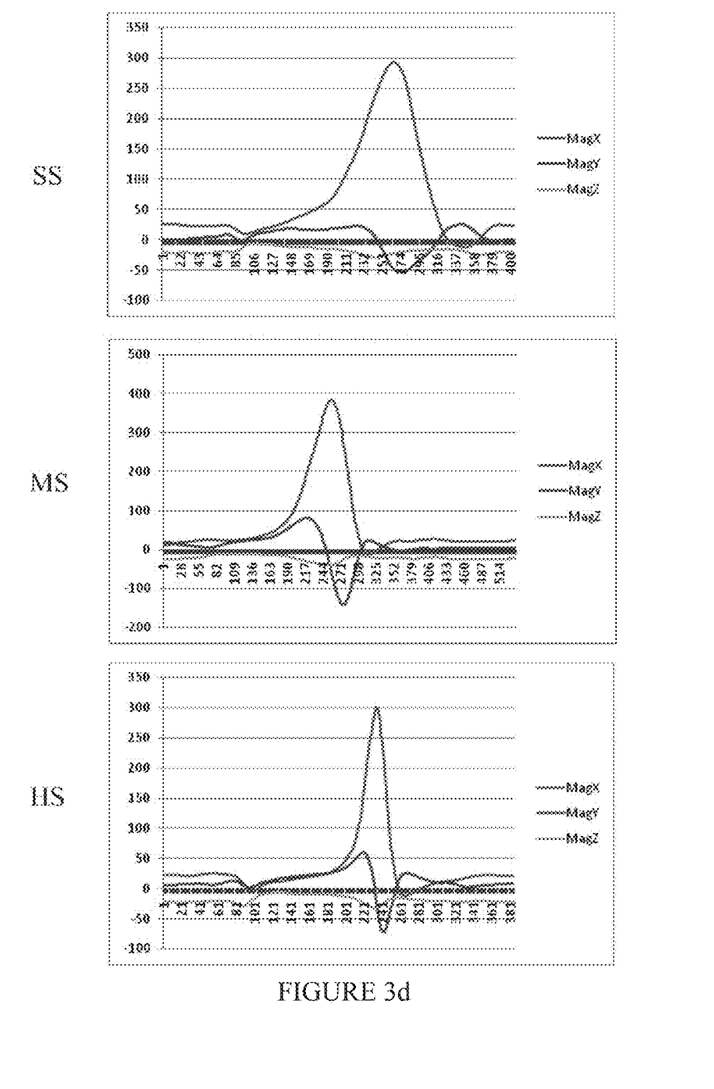

Referring to FIG. 3a, a graphical representation of the magnetic lines of force based on orientation of the magnetic field created by a setup of three orthogonally placed permanent/rare-earth magnets is illustrated. Referring to FIG. 3b, a graphical representation of the magnetic lines of force based on orientation of the magnetic field created by a setup of three straight parallelly placed permanent/rare-earth magnets is illustrated. Referring to FIG. 3c, a graphical representation of the magnetic lines of force based on orientation of the magnetic field created by a setup of three slanting parallelly placed permanent/rare-earth magnets is illustrated. Referring to FIG. 3d, a graphical representation of the magnetic lines of force based on orientation of the magnetic field created by a setup of three slanting concavo-convexly placed permanent/rare-earth magnets is illustrated.

The magnetic lines of force differ as illustrated in each of the above referred figures when a person carrying a smartphone comprising a 3-axis magnetometer sensor passes through the magnetic field at slow speed (SS), medium speed (MS) and high speed (HS).

As seen in FIGS. 3a, 3b, 3c and 3d, the speed factor only causes broadening of the peak signals and hence the orientations can be identified even if one person travels faster or slower than the other. Accordingly the method of detection is based on "wavelet analysis" which takes into account this factor of broadening or narrowing of peaks. Furthermore, it should be noted that one single peak is seen on X-axis as expected, however the Y-axis shows unique "signature" for each orientation and hence can be used for characterization. Thus, with two magnets $2^2=4$ different configurations can be achieved. Similarly by using more number of magnets, even more number of uniquely identifiable signatures can be achieved. Notably, if the direction of motion of the person changes, the direction of the field changes as well, thereby converting the peaks into troughs. However the signal signature remains similar and can be detected uniquely. Thus this method enables determining whether the person was entering or exiting the room.

Figure 4:
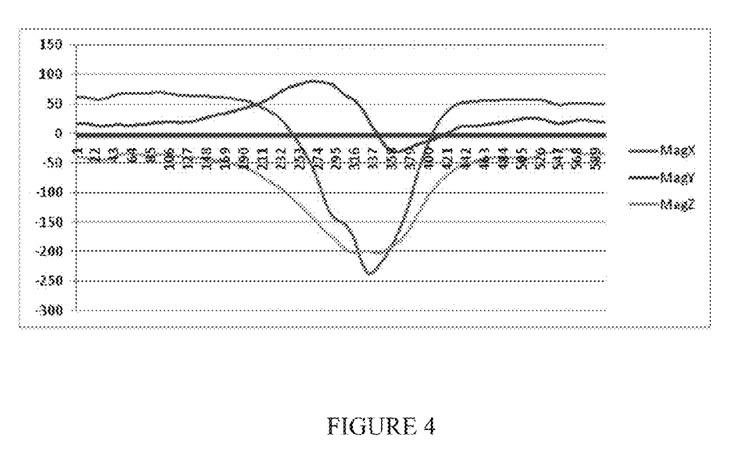
FIG. 4 is a graphical representation illustrating magnetic lines of force when magnets disposed on a doorway are oriented randomly.

Referring to FIG. 4, a graphical representation of the magnetic lines of force based on orientation of the magnetic field created by a setup of three randomly placed permanent/rare-earth magnets is illustrated. The readings are significant in the Z-axis when the magnets are placed along vertically different locations along opposite panels.

Figure 5A:
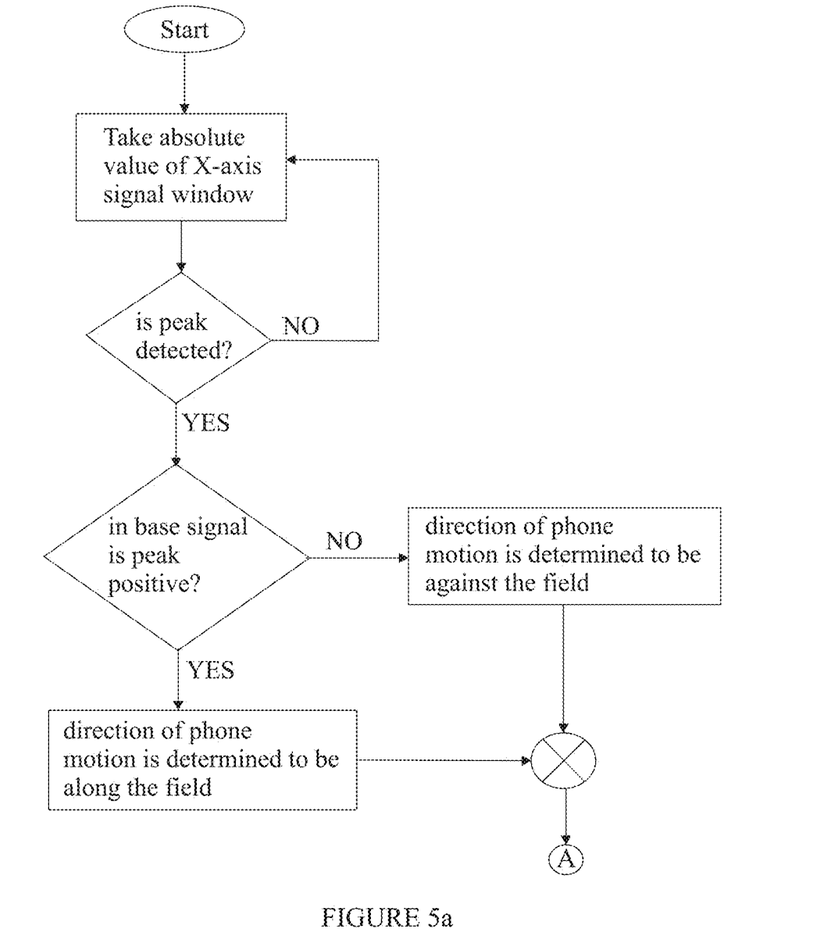
FIGS. 5a and 5b illustrate a flow chart depicting the steps involved in a method of detecting and localizing a moving subject in an enclosed environment in accordance with one embodiment of the present disclosure.
Figure 5B:
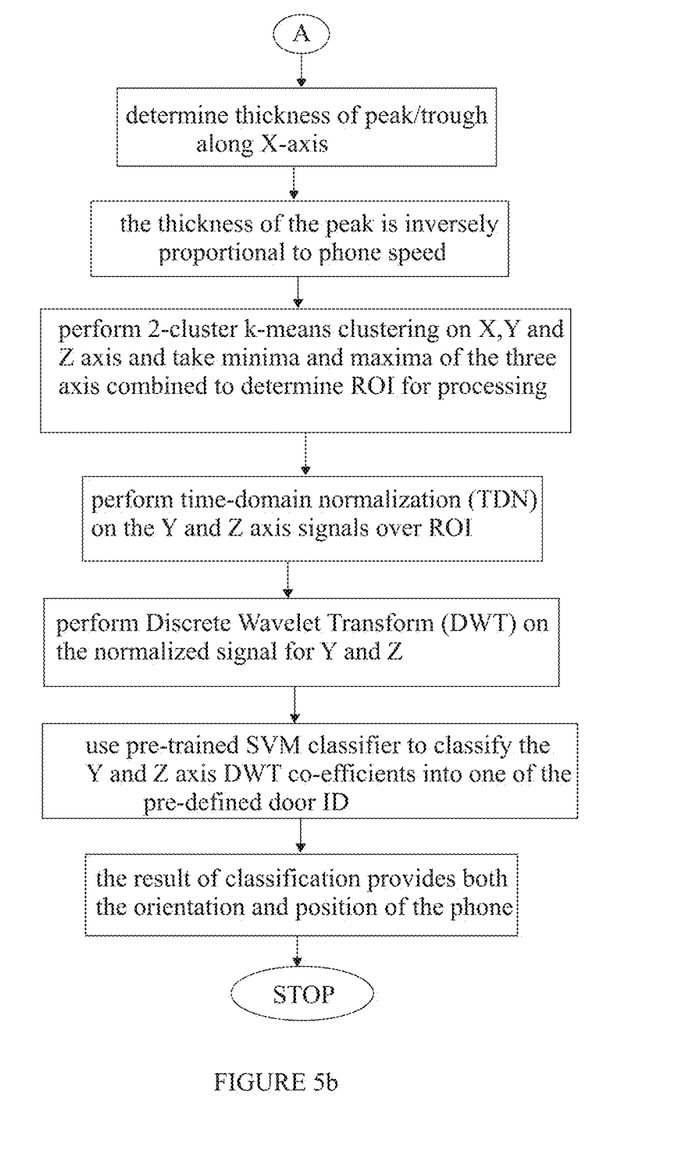

Referring to FIGS. 5a and 5b, the aforementioned method of detecting and localizing a moving subject in an enclosed environment typically comprises the following steps:

computing absolute value of a pre-determined sample of a data along the X-axis;

detecting peak/trough of the data sample along the X-axis;

comparing the peak of the data sample along the X-axis with the peak of a base signal to determine the direction of motion of the moving subject/smartphone, wherein typically the direction of motion of the moving subject/smartphone is along the magnetic field upon detecting that the peak of the original signal is positive and against the magnetic field upon detecting that the peak of the original signal is negative;

determining thickness/width of the peak/trough of the data sample along the X-axis, wherein typically the thickness/width of the peak/trough of the data sample is inversely proportional to the speed of the moving subject through the portioning means;

performing data mining on the data sample along X, Y and Z axes by a cluster analysis method to determine Region of Interest (ROI), wherein the step of data mining includes:
  performing 2-cluster k-means clustering on the data sample along X, Y and Z axes; and
  utilizing the maxima and minima of the data sample along X, Y and Z axes to determine ROI for processing.

performing Time Domain Normalization (TDN) on the data sample along with the data sample along Y-axis and Z-axis over the ROI to obtain normalized signals for Y-axis and Z-axis;

performing Discrete Wavelet Transform (DWT) on the normalized signals for Y-axis and Z-axis; and classifying the DWT coefficients of the Y-axis and Z-axis by using a pre-determined classification method, into a pre-defined identification of the doorway to localize the moving subject, wherein typically the classification method is Support Vector Machine (SVM) based classification method.

Furthermore, the method as disclosed herein above can also be implemented to determine orientation of the smartphone by using the SVM based classification method.

Thus, the indoor positioning system of the present disclosure provides a mechanism by which magnetometer disturbances on a smartphone/mobile phone due to permanent magnets can be analyzed to provide magnetic identification of the doorways. This system and the implemented method are not affected by changes in environment as field due to permanent magnets is much stronger than disturbances in the geomagnetic field. Furthermore, the field properties of permanent/rare-earth magnets remain unaffected by changes in weather conditions.

TECHNICAL ADVANCEMENTS AND ECONOMIC SIGNIFICANCE

The technical advancements offered by the indoor positioning system of the present disclosure include the realization of:

localizing a person/object in an indoor environment;
detecting the orientation and direction of the person/object;
independence from disturbances due to environmental changes;
elimination of inertial navigation errors; and
no incurrence of infrastructural changes and cost effectiveness.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

The use of the expression "at least" or "at least one" suggests the use of one or more elements or ingredients or quantities, as the use may be in the embodiment of the invention to achieve one or more of the desired objects or results.

Any discussion of documents, materials, devices, articles or the like that has been included in this specification is solely for the purpose of providing a context for the invention. It is not to be taken as an admission that any or all of these matters form part of the prior art base or were common general knowledge in the field relevant to the invention as it existed anywhere before the priority date of this application.

The numerical values mentioned for the various physical parameters, dimensions or quantities are only approximations and it is envisaged that the values higher/lower than the numerical values assigned to the parameters, dimensions or quantities fall within the scope of the invention, unless there is a statement in the specification specific to the contrary.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the embodiments as described herein.

It is to be understood that although the invention has been described above in terms of particular embodiments, the foregoing embodiments are provided as illustrative only, and do not limit or define the scope of the invention. Various other embodiments, including but not limited to the following, are also within the scope of the claims. For example, elements and components described herein may be further divided into additional components or joined together to form fewer components for performing the same functions.

Any of the functions disclosed herein may be implemented using means for performing those functions. Such means include, but are not limited to, any of the components disclosed herein, such as the computer-related components described below.

The techniques described above may be implemented, for example, in hardware, one or more computer programs tangibly stored on one or more computer-readable media, firmware, or any combination thereof. The techniques described above may be implemented in one or more computer programs executing on (or executable by) a programmable computer including any combination of any number of the following: a processor, a storage medium readable and/or writable by the processor (including, for example, volatile and non-volatile memory and/or storage elements), an input device, and an output device. Program code may be applied to input entered using the input device to perform the functions described and to generate output using the output device.

Each computer program within the scope of the claims below may be implemented in any programming language, such as assembly language, machine language, a high-level procedural programming language, or an object-oriented programming language. The programming language may, for example, be a compiled or interpreted programming language.

Each such computer program may be implemented in a computer program product tangibly embodied in a machine-readable storage device for execution by a computer processor. Method steps of the invention may be performed by one or more computer processors executing a program tangibly embodied on a computer-readable medium to perform functions of the invention by operating on input and generating output. Suitable processors include, by way of example, both general and special purpose microprocessors. Generally, the processor receives (reads) instructions and data from a memory (such as a read-only memory and/or a random access memory) and writes (stores) instructions and data to the memory. Storage devices suitable for tangibly embodying computer program instructions and data include, for example, all forms of non-volatile memory, such as semiconductor memory devices, including EPROM, EEPROM, and flash memory devices; magnetic disks such as internal hard disks and removable disks; magneto-optical disks; and CD-ROMs. Any of the foregoing may be supplemented by, or incorporated in, specially-designed ASICs (application-specific integrated circuits) or FPGAs (Field-Programmable Gate Arrays). A computer can generally also receive (read) programs and data from, and write (store) programs and data to, a non-transitory computer-readable storage medium such as an internal disk (not shown) or a removable disk. These elements will also be found in a conventional desktop or workstation computer as well as other computers suitable for executing computer programs implementing the methods described herein, which may be used in conjunction with any digital print engine or marking engine, display monitor, or other raster output device capable of producing color or gray scale pixels on paper, film, display screen, or other output medium.

Any data disclosed herein may be implemented, for example, in one or more data structures tangibly stored on a non-transitory computer-readable medium. Embodiments of the invention may store such data in such data structure(s) and read such data from such data structure(s).

The invention claimed is:

1. An indoor positioning system for localizing a moving subject in an enclosed environment, divided into functional spaces, said environment having at least one opening for providing access to said functional spaces, said moving subject being a person or an object moving through the enclosed environment, said system comprising:
at least two permanent magnets disposed on the opening in a pre-determined orientation to create a unique magnetic field for each opening;
a wireless communication unit associated with the moving subject, said wireless communication unit comprises:
at least one magnetometer sensor, said magnetometer sensor adapted to sense perturbations in each of said unique magnetic fields in the event that the moving subject passes through the openings, and generate signals corresponding to at least one parameter selected from the group consisting of:
direction of motion of the moving subject along X, Y and Z axes,
orientation of said wireless communication unit,
orientation of said magnetic field, and
speed of motion of the moving subject; and
a processor adapted to receive said signals and extract data corresponding to said parameters; and
a backend server wirelessly communicating with said wireless communication unit, said backend server adapted to process said data received from said wireless communication unit by using a pre-determined processing method to identify the openings and said wireless communication unit to localize the moving subject, wherein said pre-determined processing method comprises:
computing absolute value of said data along X-axis;
detecting peak/trough of said data along the X-axis;
comparing the peak of said data along the X-axis with the peak of a base data to determine the direction of motion of the moving subject along two directions, said directions being along the magnetic field or against the magnetic field;
determining width of the peak/trough of said data along the X-axis;
performing data mining on said data along the X, Y and Z axes by a cluster analysis method to determine Region of Interest (ROI);
performing Time Domain Normalization (TDN) on said data along with the data along Y-axis and Z-axis over said ROI to obtain normalized data for the Y-axis and the Z-axis;
performing Discrete Wavelet Transform (DWT) on the normalized data for the Y-axis and the Z-axis; and
classifying the DWT coefficients of the Y-axis and the Z-axis by using a pre-determined classification method to localize the moving subject.

2. The indoor positioning system as claimed in claim 1, wherein said permanent magnets are rare-earth magnets.

3. The indoor positioning system as claimed in claim 1, wherein said at least two permanent magnets are placed at an opening in an orientation selected from the group consisting of orthogonal placement, straight parallel placement, slanting parallel placement, slanting concavo-convex placement and random placement with reference to each other.

4. The indoor positioning system as claimed in claim 1, wherein said wireless communication unit is at least one of a smartphone and a mobile phone.

5. The indoor positioning system as claimed in claim 1, wherein said magnetometer sensor is a three-axis magnetometer sensor.

6. A method for localizing a moving subject in an enclosed environment, divided into functional spaces said environment having at least one opening for providing access to said spaces, said moving subject being a person or an object moving through the enclosed environment, said method comprising the following steps:
positioning at least two magnets at each opening in a pre-determined orientation to create a magnetic field;
sensing perturbations in the magnetic field, using a magnetometer sensor, along X, Y and Z axes and generating corresponding signals;
receiving said signals and extracting associated data;
communicating said data to a processor; and
processing the communicated data by using a pre-determined processing method to identify an opening and localize the moving subject, wherein the step of processing said communicated data by using a pre-determined processing method further comprises the following steps:

computing absolute value of said communicated data along X-axis;

detecting peak/trough of said communicated data along the X-axis;

comparing the peak of said communicated data along the X-axis with the peak of a base data to determine the direction of motion of the moving subject along two directions, said directions being along the magnetic field or against the magnetic field;

determining width of the peak/trough of said communicated data along the X-axis;

performing data mining on said communicated data along the X, Y and Z axes by a cluster analysis method to determine Region of Interest (ROI);

performing Time Domain Normalization (TDN) on said communicated data along with the communicated data along the Y-axis and the Z-axis over said ROI to obtain normalized data for the Y-axis and the Z-axis;

performing Discrete Wavelet Transform (DWT) on the normalized data for the Y-axis and the Z-axis; and classifying the DWT coefficients of the Y-axis and the Z-axis by using a pre-determined classification method to localize the moving subject.

7. The method as claimed in claim 6, wherein the step of performing data mining includes the following steps:

performing 2-cluster k-means clustering on said communicated data along X, Y and Z axes; and utilizing the maxima and minima of said communicated data along X, Y and Z axes.

8. The method as claimed in claim 6, wherein said classification method is Support Vector Machine (SVM) based classification method.

* * * * *